United States Patent [19]

Ahiskali

[11] Patent Number: 4,536,826

[45] Date of Patent: Aug. 20, 1985

[54] SNAP-IN BUS BAR

[75] Inventor: Serhat M. Ahiskali, Randolph, N.J.

[73] Assignee: AT&T Bell Laboratories, Murray Hill, N.J.

[21] Appl. No.: 649,197

[22] Filed: Sep. 10, 1984

[51] Int. Cl.$^3$ .......................... H01R 9/03; H02G 5/00
[52] U.S. Cl. .................................. 361/407; 174/72 B
[58] Field of Search ............... 361/400, 404, 407, 398; 174/72 B, 71 B, 70 B, 68 B; 339/17 L, 17 C

[56] References Cited

U.S. PATENT DOCUMENTS

| | | | |
|---|---|---|---|
| 3,838,203 | 9/1974 | Brandlien et al. | 174/68.5 |
| 3,963,293 | 6/1976 | McKee | 339/17 L |
| 4,266,091 | 5/1981 | Funkda | 174/72 B |
| 4,353,609 | 10/1982 | Haas | 339/17 C |
| 4,401,844 | 8/1983 | Fleuret | 174/72 B |
| 4,420,653 | 12/1983 | Fukuda et al. | 174/72 B |
| 4,451,694 | 5/1984 | Harper et al. | 174/72 B |

Primary Examiner—A. T. Grimley
Assistant Examiner—T. M. Basma
Attorney, Agent, or Firm—Alfred G. Steinmetz

[57] ABSTRACT

A snap-in bus bar is mechanically affixed to a printed circuit board to increase mechanical stiffness of the board and electrically connected to the printed circuit paths to provide a high current capacity conducting path. The bus bar includes a support member to provide insulation between conducting members attached thereto.

15 Claims, 9 Drawing Figures

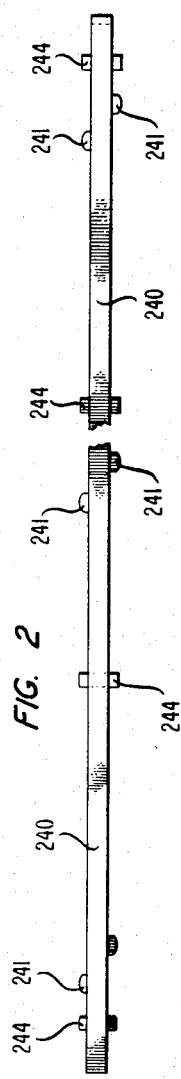
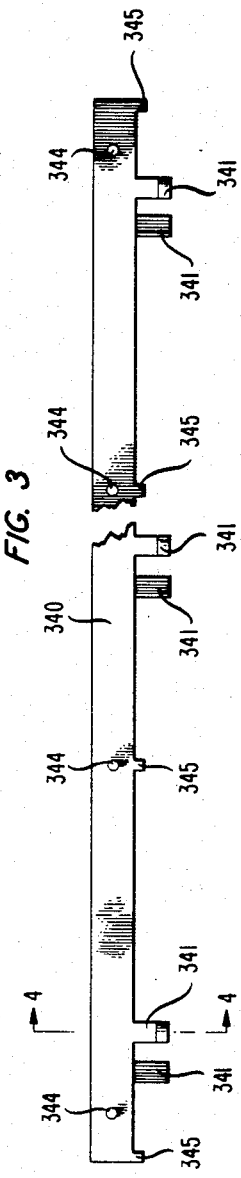
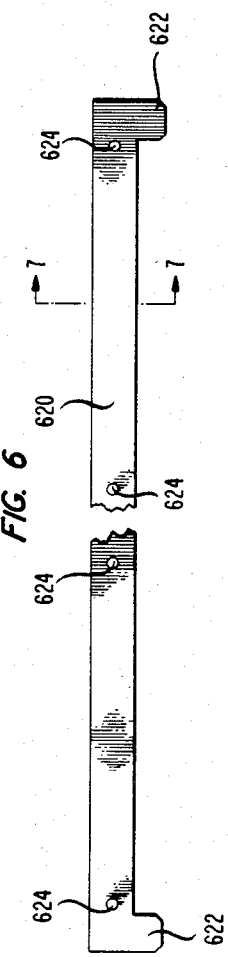

SNAP-IN BUS BAR

BACKGROUND OF THE INVENTION

This invention relates to circuit boards and their manufacture and more particularly to an improved bus bar structure to be used with such circuit boards to provide increased current carrying capacity and to increase board rigidity during the manufacturing and subsequent shipping processes.

Printed circuits on printed circuit boards frequently need conductors with high current carrying capacities in order to carry substantial current loads beyond that which the normal printed circuit paths are capable of carrying. Many times the current carrying capacity of a circuit board is augmented by adding a high current capacity bus bar to interconnect selected printed circuit paths on the circuit board. This interconnection is normally achieved by soldering the bus bar to the selected printed circuit path.

Wave soldering is probably one of the most widely used techniques of connecting current carrying components to printed circuit boards. The printed circuit boards have their components placed thereon or inserted therein and are placed on a conveyer system which causes the circuit board to pass through a fluxing unit, a preheating unit and a solder wave unit. As the circuit boards pass along the conveyer system, they contact the solder wave and each of the junctions to be soldered is maintained in contact with the solder wave for a controlled time. A small amount of solder remains in the solderable areas of the printed circuit board and makes the connections while excess solder returns into the solder wave machine. Following the soldering operation, the circuit board is subjected to a defluxing operation. These manufacturing operations subject the circuit boards along the conveyer to various mechanical vibrations and twisting which may move components about or distroy solder connections already made. These disturbing vibrations and twisting may be caused by any of the many operations that occur to the printed wiring board while being carried along the conveyer system. The circuit board is also subjected to many of these same and additional forces during product shipment which may cause breaks in existing solder connections.

SUMMARY OF THE INVENTION

A printed circuit board embodying the principles of the invention and needing conductors having high current carrying capacity, includes a snap-in bus bar which includes a plastic insulator support member mechanically affixed to the circuit board and supporting and separating two conducting bus bars electrically connected to printed circuit paths of the circuit board. The plastic insulator support member includes snap-in fingers or connecting members which have catch ends to engage and clip into receptacles in the printed circuit board to hold the bus bar in place during manufacturing before the wave soldering operation. These connecting members cooperate with support pegs or elements which rest on the surface of the circuit board to provide rigidity to the circuit board thereafter. By mechanically fastening this bus bar configuration to the printed circuit board very early in the manufacturing process, significant mechanical stiffening is added to the circuit board which reduces the probability of damage to the circuit board due to twisting, vibrations and the other mechanical forces to which it is subjected to during subsequent manufacturing operations and during subsequent product shipping.

BRIEF DESCRIPTION OF THE DRAWINGS

An appreciation and understanding of the invention may be attained by reference to the following specification and the attached drawing in which:

FIG. 2 is a top view of the support member of the bus bar assembly;

FIG. 3 is a side view of the support member of FIG. 2;

FIG. 6 is a side view of one of the conducting bus bars;

FIG. 7 is an end view of the conducting bus bar of FIG. 6;

FIG. 8 is a side view of the snap-in bus bar assembly; and

DETAILED DESCRIPTION

Figure 1:
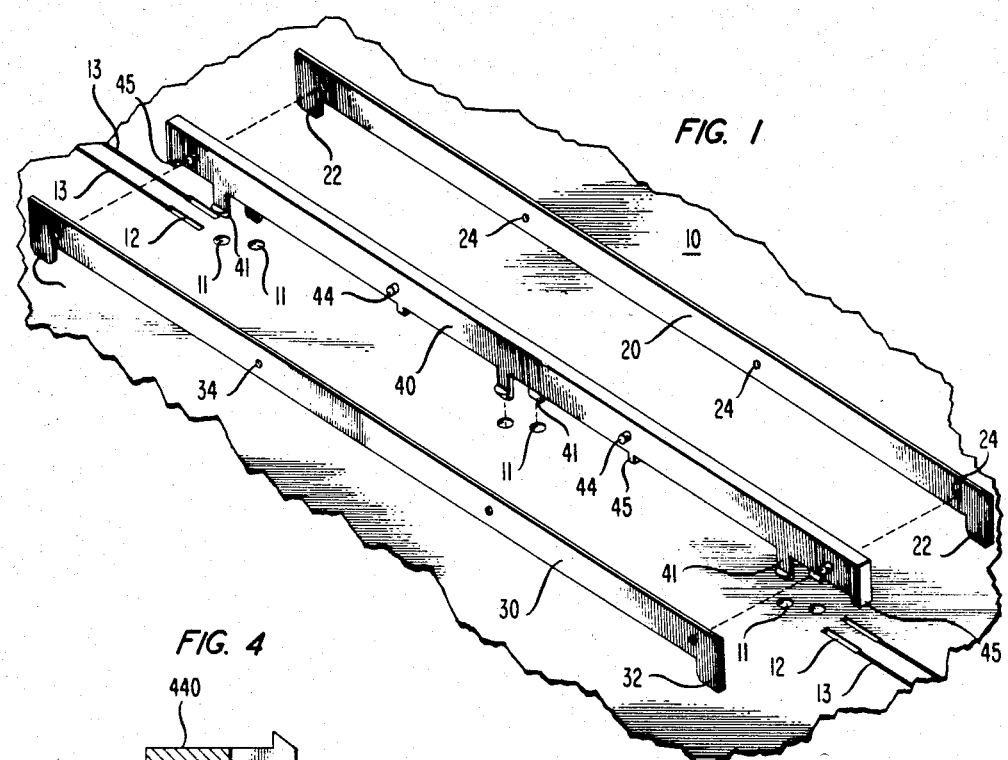
FIG. 1 discloses an exploded assembly type perspective view of the snap-in bus bar assembly and the circuit board to which it is attached.

A snap-in bus bar assembly embodying the principles of the invention is shown in an exploded type perspective drawing in FIG. 1. Its central member is the bus bar support member 40 which includes snap-in fingers or connecting members 41 which have hook or catch devices operative to secure the support member 40 to a printed circuit board 10. The printed circuit board 10 has securing holes 11 through which the snap-in fingers are inserted. The snap-in fingers 41 are dimensioned so that their hook or catch devices will maintain the support pegs or elements 45 on the surface of the printed circuit board which, in turn, keep the catch devices engaged on the opposite under surface of the board 10. The conducting members or bus bars 20 and 30 are connected to opposite sides of the support member 40. The conducting bus bars 20 and 30 are attached to the support member 40 by the connecting pins 44 on the support member 40 which penetrate holes 24 and 34 in the conducting members 20 and 30. While the support member is illustrated herein with two bus bars affixed to opposite sides of the support member, it is to be understood that the assembly could be used with one bus bar affixed to one side only. The completed snap-in bus bar assembly is shown in a top view and a side cross sectional view in FIGS. 8 and 9. (The final two digits of component identifying numbers in the various figures refer to identical components appearing in the different figures.) Tab ends 32 of the conducting members 20 and 30, as shown in FIG. 1, fit into conduction slots 12 cut into the printed circuit boards. Here a solder connection from the conducting tabs 32 of the conducting bars 20 and 30 is made to the printed circuit paths 13 shown on the printed circuit board.

Figure 4:
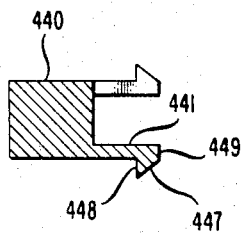
FIG. 4 is a cross section of the support member of FIGS. 2 and 3.

The connecting pins 244 of the support member, as shown in FIG. 2, pass through the support member 240 from one side to the other. They are dimensioned to pass through a hole (624 in FIG. 6) in the attached conducting member and to leave a sufficient shank end to be flattened into a head to secure the conducting member to the support member. The support member 240 may be constructed of a polycarbonate material or any suitable insulating material having sufficient strength and rigidity to add rigidity to the printed circuit board. The connecting members 241 are grouped into offset pairs, and each have hook or catch devices located on one end. Members of each pair of connecting members 241 are alternatively connected on opposite sides of the support member 240. These connecting members 241 are distributed along the support members 240 in pairs with the catch devices alternately oriented in oppositely facing directions. This pairing of connecting members and the opposite facing orientation of catch devices permits the receptacle holes 11 in the printed circuit board to have a greater distance between paired holes and thereby decrease the likelihood of circuit board fracture developing due to closeness of the holes. An exemplary staggering and positioning of the connecting members 241 and opposing orientation of the catch devices may be seen readily in FIGS. 2 and 3 where a support member identical to that shown in FIG. 1 is shown having three pairs of connecting members 241 and 341 distributed along its length. The catch devices 448 as shown in FIG. 4 of each pair are oriented in opposite directions. The number of pairs of connecting members is not restricted to three pairs, however, and is a variable dependent upon the overall length of the support member used with any particular circuit board.

The connecting members 41 are in register with the connecting member receiving holes 11 which are placed in the printed circuit board. A cross sectional view of exemplary connecting members 441 is shown in FIG. 4 and is shown therein as having a certain length which is sufficient to allow a catch device 448 to latch on to a bottom surface portion of the circuit board. This length is dependent upon the height of the support elements 345 (shown in FIG. 3) which rest upon the top surface of the printed circuit board.

Figure 5:
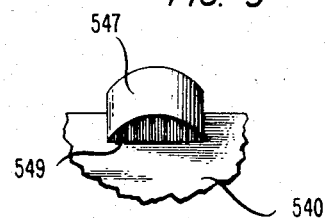
FIG. 5 is a bottom view of a mechanical connection finger of the support member of FIGS. 2, 3 and 4.

Entry of the catch device into the connecting member receiving hole 11 of the circuit board, is facilitated by an entry ramp 447 which has a skewed cylindrical surface shape 547 as shown in FIG. 5. The bottom of the connecting member may be terminated in a flat surface as shown by flat surfaces 449 and 549 in FIGS. 4 and 5, respectively.

The support elements 45 maintain the support member 40 at a fixed distance above the top surface of the circuit board after the connecting members 41 are fully engaged with the holes 11. They also serve to keep the catch device of the connecting members 41 fully engaged with the under surface of the board. The opposing forces generated by the support elements and connecting members on opposite sides of the board have a significant mechanical stiffening effect on the circuit board.

The conducting bus bar members 20 and 30 include tabs 22 and 32 at each end which fit into corresponding slots 12 in the printed circuit board. These conducting bus bar members can be connected to different ones of the printed circuit paths or one circuit path can be combined at the slots 12 to use both conducting members in parallel thereby doubling the current carrying capacity for a single current path.

Details of the conducting members 20 and 30 are shown in FIGS. 6 and 7. A side view of the assembled bus bar arrangement is shown in FIG. 8 where the two conducting bars are shown connected to opposite sides of the support member. As shown the conducting tabs 822 extend below the support elements 845, of the support bar, to an extent substantially equaling the connecting members 841 so that the tabs 822 can penetrate into the slots cut into the printed circuit board.

Figure 9:
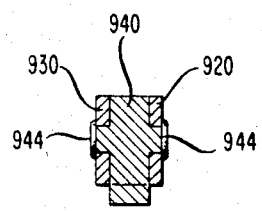
FIG. 9 is a cross section view of the snap-in bus bar assembly of FIG. 8.

The method of attaching the conducting members 920 and 930 to opposite sides of the support member 940 is shown in FIG. 9 where as shown the shank ends of the pins 944 are heat staked or have their shank ends flattened or bent to form tinners like rivet heads which are formed on opposite ends of the shanks of the pins to secure the conducting members 920 and 930 to the support member 940.

The snap-in bus bar is preferably attached to the printed circuit board before any connecting or soldering operations for the various components are begun. Hence, when the printed circuit board and its components are placed on the conveyer leading to the wave soldering operation, the snap-in bus bar is already securely mechanically attached to the printed circuit board offering considerable mechanical stiffening to a very thin printed circuit board which due to its thinness is very readily subject to warping and vibration movements which could cause damage to the printed circuits, break connections or dislocate components already placed thereon. The conducting members 20 and 30 are appropriately tinned so that during the wave soldering operation a solder connection is automatically made between the conducting members 20 and 30 and the printed circuit paths 13 joining the connecting slots 12 in the printed circuit board 10.

Since the snap-in bus bar is raised off the printed circuit board, it permits layout ease in the attachment and positioning of components and it additionally provides significant mechanical stiffening to the printed circuit board before, during and after the wave soldering operation. The mechanical stiffening effect due to the mechanical connections of the bus bar to the board continues after completion of the manufacturing operations and add valuable stiffening to the printed circuit board during commercial transport of the circuit board.

While a particular illustrative example embodying the principles of the invention has been disclosed herein, it is readily apparent that the principles of the invention may be applied by those skilled in the art to other variations thereof without departing from the spirit and scope of the invention.

What is claimed is:

1. In combination:
   a circuit board,
   a bus bar assembly mounted on the circuit board comprising:
   a support member having electrical insulation properties, and first and second conducting members affixed to opposite sides of the support member respectively,
   the circuit board including receptacle means and the support member including connecting members for engaging the receptacle means and mechanically affixing the support member to the circuit board, and
   the first and second conducting members each including conducting connecting means for coupling the first and second conducting members to conducting paths in the circuit board.

2. The combination as defined in claim 1 wherein the support member further includes a plurality of support elements for maintaining the support member at a fixed distance above a surface of the circuit board.

3. The combination as defined in claim 2 wherein the connecting members comprise a plurality of fingers extending from the support member in register with the receptacle means which comprise holes in the circuit board, the fingers having securing means which comprise a catch means on its free end with a flat catch surface perpendicular to the finger to catch an underside of the circuit board and secure the support member to the circuit board and cylindrical surface ramp means below the flat catch surface to facilitate entry of the finger into the holes in the circuit board.

4. The combination as defined in claim 3 wherein the support member includes a plurality of pins extending from both sides of the support member and the first and second conducting members include a plurality of pin holes in register with the pins and the first and second conducting members being secured to opposite sides of the support member by placing pin holes of the first and second conducting members over the pins so they penetrate the pin holes and flattening a shank end of the pins to form a head to secure the first and second conducting members to the support member.

5. The combination as defined in claim 4 wherein the conducting connecting means of the first and second conducting members include conducting tabs at their respective ends and the circuit board includes precut slots connected to printed circuit paths for accepting the tabs.

6. The combination as defined in claim 5 wherein the fingers having securing means are spaced in pairs offset from each other with alternate members of each pair having oppositely oriented catch means.

7. In combination:
a printed circuit board including at least a printed conductive path thereon,
a bus bar assembly electrically connected to a printed conductive path on the printed circuit board including:
a support member of electrically insulating material and being substantially elongated in one dimension in parallel with a surface of the circuit board, and
first and second conducting members affixed on opposite sides of the support member, respectively, each conducting member having an elongated perimeter substantially congruent with a perimeter of the support member, the opposite ends of the conducting members including tabs to facilitate an electrical connection to a printed conductive path on the circuit board,
the support member including at least first, second and third pairs of connecting members each substantially perpendicular to the elongated one dimension of the support member and each connecting member having a hook end, the connecting members being grouped in pairs and each connecting member at each pair of conducting members being offset from each other and having their hook ends oriented in opposite directions,
the printed circuit board including a plurality of receptacle holes in register with the connecting members, the connecting members being inserted in the holes and secured thereto by the hook ends to mechanically secure the support member to the circuit board, and to position the conducting tabs adjacent to a selected portion of the conductive paths on the printed circuit board.

8. The combination as defined in claim 7 wherein the support member further includes a plurality supporting elements distributed along an elongated one dimension of the support member and operative to maintain the support member attached to the printed circuit board a fixed distance above a surface of the printed circuit board.

9. The combination as defined in claim 8 wherein the support member includes a plurality of pins distributed along the support member and extending beyond opposite sides of the support member, the first and second conducting members each including a plurality of pin holes in register with the pins and being attached so that the pins penetrate the pin holes with ends of shafts of the pins flattened to form a head to secure the first and second conducting members to opposite sides of the support member.

10. The combination as defined in claim 9 wherein the hook end of the connecting member comprises a projection member for engaging an underside of the printed circuit board and a ramp having a skewed cylindrical surface for facilitating entry of the connecting member into the receptacle holes of the printed circuit board.

11. The combination as defined in claim 10 wherein the printed circuit board includes slots in register with and operative for receiving the conducting tabs of the conducting members.

12. In combination:
a printed circuit board including at least a printed conductive circuit path thereon and a plurality of mechanical connection receptacle holes and a plurality of slots engaging the printed conductive circuit path,
a snap-in bus bar assembly mechanically connected to the printed circuit board and electrically connected to the printed conductive circuit path including:
a support member of an electrically insulating material and being substantially elongated in one dimension, and including first mechanical means for securing the support member to and accurately spacing it from a surface of the printed circuit board,
the first mechanical means comprising:
a plurality of support elements distributed along the one dimension and which rest upon a surface of the printed circuit board and a plurality of connecting members in register with the mechanical connection receptacle holes for engaging the mechanical connection receptacle holes and securing the support member to the printed circuit board
the connecting members each comprising a finger member with a catch element at its free end for passing through the mechanical connection receptacle holes and engaging an underside of the printed circuit board, the connecting members being grouped in pairs and the pairs distributed along the support members' elongated one dimension and the catch elements of each pair being oriented to face in opposite directions from one another,
first and second conducting members each substantially elongated in one dimension, second mechanical means for securing the first and second conducting members to opposite sides of the support member substantially congruent with a one dimension of the support means, the second mechanical means comprising a plurality of pins distributed along an elongated one dimension of the support means and in register with and penetrating pin holes in the first and second conducting members, shaft ends of the pins flattened to secure the first and second conducting members to the support means, the first and second conducting members including tabs at opposite ends in register with and operative for engaging the plurality of slots in the printed circuit board.

13. In combination:

a circuit board, a bus bar assembly mounted on the circuit board comprising:

a support member constructed of an electrical insulative material and a conducting member affixed to the support member, the circuit board including receptacle means and the support member including connecting members for engaging the receptacle means and mechanically affixing the support member to the circuit board, and the conducting member including a conducting mechanism for coupling to a conducting path in the circuit board.

14. The combination as defined in claim 13 wherein the bus bar assembly includes a second conducting member affixed to the support member.

15. The combination as defined in claims 13 or 14 wherein the conducting mechanism includes conducting tab means located at ends of the conducting member and the connecting members comprise a plurality of fingers extending from the support means in register with the receptacle means which comprise holes in the circuit board, the fingers having securing means which comprise a catch means on its free end with a flat catch surface perpendicular to the finger to catch an underside of the circuit board and secure the support member to the circuit board and cylindrical surface ramp means below the flat catch surface to facilitate entry of the finger into the holes in the circuit board.

* * * * *